US 9,806,060 B2

(12) United States Patent
Jeong

(10) Patent No.: US 9,806,060 B2
(45) Date of Patent: Oct. 31, 2017

(54) FLEXIBLE PACKAGES INCLUDING CHIPS

(71) Applicant: SK hynix Inc., Icheon-si Gyeonggi-do (KR)

(72) Inventor: Chan Woo Jeong, Chungju-si (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/431,110

(22) Filed: Feb. 13, 2017

(65) Prior Publication Data
US 2017/0154869 A1 Jun. 1, 2017

Related U.S. Application Data

(63) Continuation of application No. 15/069,615, filed on Mar. 14, 2016, now Pat. No. 9,607,968.

(30) Foreign Application Priority Data

Nov. 24, 2015 (KR) .................. 10-2015-0164756

(51) Int. Cl.
H01L 25/065 (2006.01)
H01L 23/31 (2006.01)
H01L 23/28 (2006.01)
H01L 23/29 (2006.01)
H01L 23/08 (2006.01)
(Continued)

(52) U.S. Cl.
CPC .......... H01L 25/0652 (2013.01); H01L 23/08 (2013.01); H01L 23/293 (2013.01); H01L 23/3107 (2013.01); H01L 23/3121 (2013.01); H01L 23/49811 (2013.01); H01L 23/562 (2013.01); H01L 25/0657 (2013.01); H01L 2225/0651 (2013.01); H01L 2225/06513 (2013.01); H01L 2225/06517 (2013.01); H01L 2225/06582 (2013.01)

(58) Field of Classification Search
CPC ............ H01L 25/0652; H01L 25/0657; H01L 23/3121; H01L 23/3107; H01L 23/49811; H01L 23/4985; H01L 23/293; H01L 23/562; H01L 23/08
USPC ............... 257/618, 686, 737, 773, 777, 778, 257/E23.011, E23.069, E25.023; 438/106, 110, 113, 123, 457; 361/749, 361/760; 174/254, 258
See application file for complete search history.

(56) References Cited

U.S. PATENT DOCUMENTS 6,027,958 A * 2/2000 Vu .................. H01L 21/568
257/679
6,633,078 B2 10/2003 Hamaguchi et al.
(Continued)

FOREIGN PATENT DOCUMENTS

KR 20030017677 A 3/2003

Primary Examiner — Dao H Nguyen
(74) Attorney, Agent, or Firm — William Park & Associates Ltd.

(57) ABSTRACT

A flexible package may be provided. The flexible package may include a flexible molding member including a top surface. The flexible package may include a first chip within the flexible molding member, and including a first top surface. The flexible package may include a second chip within the flexible molding member, and including a second top surface. The first top surface may face away from the top surface of the flexible molding member and the second top surface may face towards the top surface of the flexible molding member.

19 Claims, 13 Drawing Sheets

(51) Int. Cl.
*H01L 23/00* (2006.01)
*H01L 23/498* (2006.01)

(56) References Cited

U.S. PATENT DOCUMENTS

| | | | |
|---|---|---|---|
| 7,091,619 B2* | 8/2006 | Aoyagi | H01L 23/49816 257/686 |
| 7,138,723 B2* | 11/2006 | Aiba | H01L 23/3128 257/737 |
| 7,633,157 B2 | 12/2009 | Jiang et al. | |
| 9,041,180 B2 | 5/2015 | Lee | |
| 9,224,716 B2* | 12/2015 | Fan | H01L 27/14618 |
| 2001/0049155 A1* | 12/2001 | Yamaji | H01L 23/13 438/106 |
| 2014/0361427 A1* | 12/2014 | Kim | H01L 23/49811 257/737 |
| 2015/0171028 A1 | 6/2015 | Jo et al. | |
| 2015/0348942 A1 | 12/2015 | Kim | |
| 2016/0056091 A1 | 2/2016 | Kim et al. | |

* cited by examiner

FIG. 2
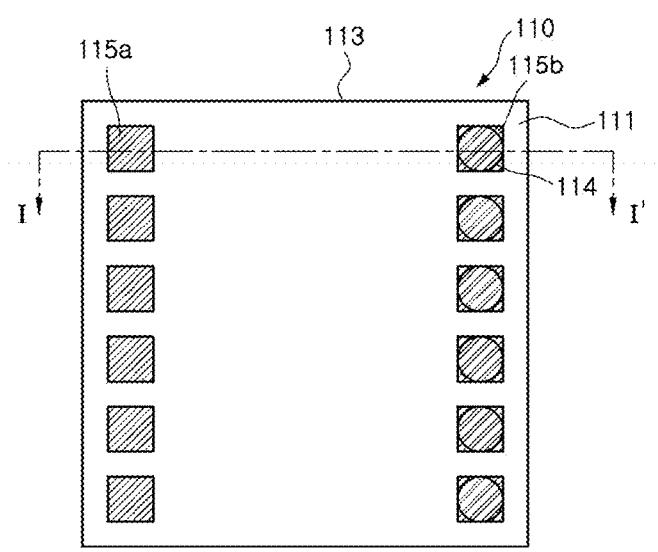
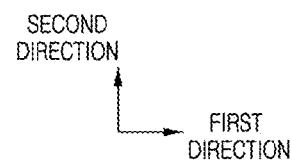

FLEXIBLE PACKAGES INCLUDING CHIPS

CROSS-REFERENCE TO RELATED APPLICATION

The present application is a continuation application of U.S. application Ser. No. 15/069,615, filed on Mar. 14, 2016, and claims priority under 35 U.S.C 119(a) to Korean Patent Application No. 10-2015-0164756, filed on Nov. 24, 2015, which is herein incorporated by references in its entirety.

BACKGROUND

1. Technical Field

Various embodiments of the present disclosure generally relate to packages and, more particularly, to flexible packages including chips.

2. Related Art

Semiconductor packages capable of processing a large amount of data are increasingly in demand with the development of smaller electronic systems such as mobile systems. As the electronic systems become lighter and smaller, the semiconductor packages employed in the electronic systems have been continuously scaled down. In addition, flexible electronic systems which are capable of bending or warping are increasingly in demand with increase of the interest in portable and wearable electronic systems.

Meanwhile, semiconductor chips employed in semiconductor packages have been fabricated to have a reduced thickness. As a result, the semiconductor chips may have a warped shape after the semiconductor chips are completely fabricated. In general, if a warped semiconductor chip is attached to another semiconductor chip or a package substrate, an electrical connection failure may occur. Accordingly, a process for compensating for warpage of the semiconductor chip may be required to obtain a reliable semiconductor package.

SUMMARY

Various embodiments may be directed to flexible packages including warped chips.

According to an embodiment, a flexible package may include a flexible molding member including a top surface. The flexible package may include a first chip within the flexible molding member, and including a first top surface. The flexible package may include a second chip within the flexible molding member, and including a second top surface. The first top surface may face away from the top surface of the flexible molding member and the second top surface may face towards the top surface of the flexible molding member.

According to an embodiment, a flexible package may include a first chip, a second chip, a flexible molding member surrounding the first and second chips, and a first connector and a second connector disposed on the flexible molding member. The first chip may include a first top surface on which a first electrical connection structure is disposed. The first chip may be disposed to be upside down so that the first top surface faces downwardly, and both edges of the first chip are bent in a first direction so that the first chip has a smile shape or a crying shape. The second chip may be a second top surface on which a second electrical connection structure is disposed. The second chip may be disposed so that the second top surface faces upwardly, and both edges of the second chip may be bent in a second direction so that the second chip includes a crying shape or a smile shape.

According to an embodiment, a flexible package may include a flexible molding member including a top surface, a first chip within the flexible molding member, and including a first top surface, a second chip within the flexible molding member, and including a second top surface, a third chip within the flexible molding member, and including a third top surface. The first, second, and third top surfaces are substantially concave. The first top surface faces towards the top surface of the flexible molding member. The second and third top surfaces face away from the top surface of the flexible molding member.

According to an embodiment, a flexible package may be provided. The flexible package may include a first chip, a second chip, a third chip, a flexible molding member surrounding the first to third chips, and a first connector and a second connector disposed on the flexible molding member. The first chip may include a first top surface on which a pair of first electrical connection structures are disposed. The first chip may be disposed to be upside down so that the first top surface faces downwardly, and both edges of the first chip may be bent in a first direction so that the first chip has a smile shape or a crying shape. The second chip may include a second top surface on which a second electrical connection structure is disposed. The second chip may be disposed so that the second top surface faces upwardly, and both edges of the second chip may be bent in a second direction so that the second chip has a crying shape or a smile shape. The third chip may include a third top surface on which a third electrical connection structure is disposed. The third chip may be disposed so that the third top surface faces upwardly, and both edges of the third chip may be bent in the second direction so that the third chip includes a crying shape or a smile shape.

BRIEF DESCRIPTION OF THE DRAWINGS

FIG. 2 is a plan view illustrating a representation of an example of an electrical connection structure of a first chip included in the flexible package of FIG. 1.

DETAILED DESCRIPTION

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
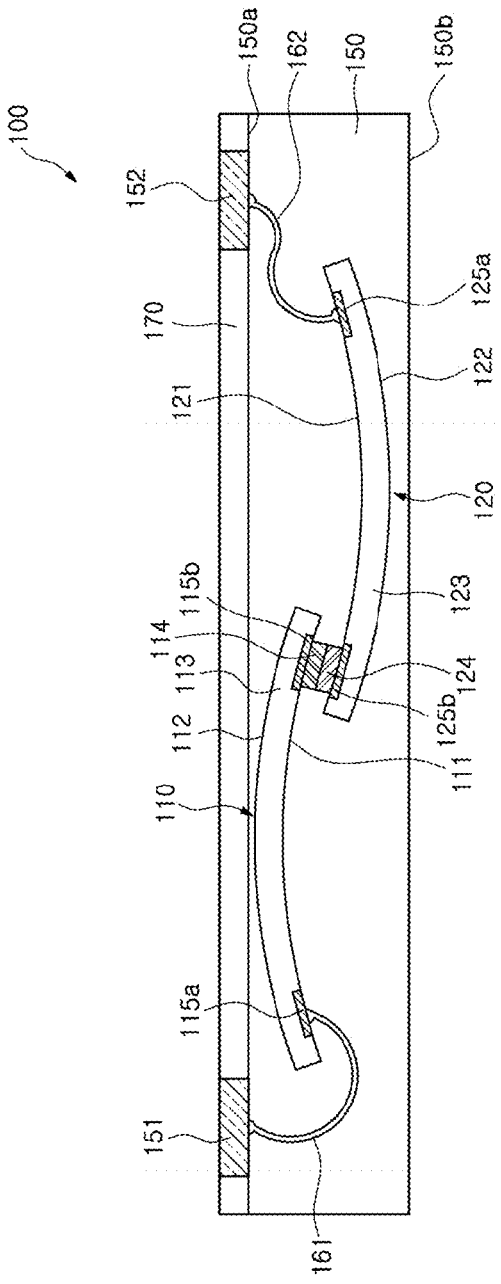
FIG. 1 is a cross-sectional view illustrating a representation of an example of a flexible package according to an embodiment.

FIG. 1 is a cross-sectional view illustrating a flexible package 100 according to an embodiment, and FIG. 2 is a plan view illustrating an electrical connection structure of a first chip included in the flexible package 100 of FIG. 1. Referring to FIG. 1, the flexible package 100 may be configured to include a first chip 110 and a second chip 120 which are embedded in a flexible molding member 150. Each of the first and second chips 110 and 120 may be comprised of an integrated circuit which is realized on and/or in a semiconductor substrate such as a silicon substrate. In an embodiment, the first and second chips 110 and 120 may be obtained by realizing integrated circuits on and/or in a single semiconductor substrate and by slicing the semiconductor substrate using a die sawing process. In such a case, the first and second chips 110 and 120 may be the same chip and may have the same function. The first and second chips 110 and 120 may have the same electrical connection structure. In an embodiment, the first chip 110 may be obtained by realizing first integrated circuits on and/or in a first semiconductor substrate and by slicing the first semiconductor substrate using a die sawing process, and the second chip 120 may be obtained by realizing second integrated circuits on and/or in a second semiconductor substrate and by slicing the second semiconductor substrate using a die sawing process. In such a case, the first and second chips 110 and 120 may be different chips and may have different functions from each other. Even though the first and second chips 110 and 120 are different chips having different functions from each other, the first and second chips 110 and 120 may be realized to have the same electrical connection structure. The first chip 110 may include a first chip body 113 having a first top surface 111 and a first bottom surface 112 which are opposite to each other. In an embodiment, the first bottom surface 112 may have substantially a convex shape facing towards the top surface 150a of the flexible molding member 150. In an embodiment, the first top surface 111 may have substantially a concave shape facing towards the bottom surface 150b of the flexible molding member 150. The first chip 110 may include a first electrical connection structure disposed on the first top surface 111 of the first chip body 113. The first electrical connection structure may include a first bump 114 and first pads 115a and 115b. The first pads 115a and 115b may be disposed at both edges of the first top surface 111 of the first chip body 113, respectively. In an embodiment, the first pads 115a and 115b may be disposed adjacent to both edges of the first top surface 111 of the first chip body 113, respectively. The first bump 114 may be disposed on one of the first pads 115a and 115b. For example, the first bump 114 may be disposed on the first pad 115b. A bottom surface of the first bump 114 may be directly attached to a top surface of the first pad 115b. The second chip 120 may include a second chip body 123 having a second top surface 121 and a second bottom surface 122 which are opposite to each other. In an embodiment, the second bottom surface 122 may have substantially a convex shape facing towards the bottom surface 150b of the flexible molding member 150. In an embodiment, the second top surface 121 may have substantially a concave shape facing towards the top surface 150a of the flexible molding member 150. The second chip 120 may include a second electrical connection structure disposed on the second top surface 121 of the second chip body 123. The second electrical connection structure may include a second bump 124 and second pads 125a and 125b. The second pads 125a and 125b may be disposed at both edges of the second top surface 121 of the second chip body 123, respectively. In an embodiment, the second pads 125a and 125b may be disposed adjacently to both edges of the second top surface 121 of the second chip body 123, respectively. The second bump 124 may be disposed on one of the second pads 125a and 125b. For example, the second bump 124 may be disposed on the second pad 125b. A bottom surface of the second bump 124 may be directly attached to a top surface of the second pad 125b.

The first electrical connection structure of the first chip 110 will be described hereinafter with reference to FIG. 2. FIG. 1 corresponds to a cross-sectional view which is taken along a line I-I' of FIG. 2. The plurality of first pads 115a and 115b may be disposed on the first top surface 111 of the first chip body 113. The first pads 115a may be disposed on a first edge (corresponding to a left edge in the drawing) of the first chip body 113 and may be arrayed in a line which is parallel with a second direction intersection a first direction. The first pads 115b may be disposed on a second edge (corresponding to a right edge in the drawing) of the first chip body 113 and may be arrayed in a line which is parallel with the second direction. The first pads 115a may be arrayed in the second direction and may be spaced apart from each other. The second pads 115b may also be arrayed in the second direction and may be spaced apart from each other. The first bumps 114 may be disposed on the first pads 115b, respectively. The second electrical connection structure of the second chip 120 may have substantially the same configuration as the first electrical connection structure of the first chip 110. Although the present embodiments are described as examples in which the first and second bumps 114 and 124 are disposed on the first and second pads 115*b* and 125*b*, the present disclosure is not limited thereto. For example, in some other embodiments, solder paste members or conductive adhesion members may be used instead of the bumps 114 and 124.

Referring again to FIG. 1, the first and second chips 110 and 120 may be embedded in the flexible molding member 150 without any compensation for warpage of the first and second chips 110 and 120. That is, each of the first and second chips 110 and 120 may warp to have a smile shape. The first chip 110 may be disposed to be upside down so that the first top surface 111 of the first chip 110 faces downwardly and may have a crying shape so that both edges of the first chip 110 are located at a lower level than a central portion of the first chip 110. The second chip 120 may be disposed so that the second top surface 121 of the second chip 120 faces upwardly and may have a smiling shape so that both edges of the second chip 120 are located at a higher level than a central portion of the second chip 120. Accordingly, the first top surface 111 of the first chip 110 may face the second top surface 121 of the second chip 120. The first chip 110 may be disposed at a higher level than the second chip 120. A vertical axis passing through a central portion of the first chip 110 may be offset by a certain distance along a lateral direction relative to a vertical axis passing through a central portion of the second chip 120. That is, an edge of the first chip 110 may overlap with an edge of the second chip 120. Specifically, the first and second chips 110 and 120 may be disposed so that the first bumps 114 of the first chip 110 overlap with the second bumps 124 of the second chip 120. The first and second bumps 114 and 124 may physically contact each other to provide connection structures that electrically connect the first chip 110 to the second chip 120. In such a case, the first pads 115*a* of the first chip 110 may be disposed in an edge (corresponding to a left edge in the drawing) of the flexible molding member 150 not to overlap with the second chip 120 and may be disposed to face downwardly. In addition, the second pads 125*a* of the second chip 120 may be disposed in another edge (corresponding to a right edge in the drawing) of the flexible molding member 150 not to overlap with the first chip 110 and may be disposed to face upwardly. That is, the first pads 115*b* of the first chip 110 may overlap with the second pads 125*b* of the second chip 120, respectively.

The flexible molding member 150 may have a top surface 150*a* and a bottom surface 150*b* that are opposite to each other. A supporting layer 170 may be disposed on the top surface 150*a* of the flexible molding member 150. First connectors 151 and second connectors 152 may be disposed in both edges of the supporting layer 170, respectively. The first and second connectors 151 and 152 may be disposed to penetrate the supporting layer 170. The supporting layer 170 may include a material which is harder than the flexible molding member 150. Thus, the supporting layer 170 may support the first and second connectors 151 and 152 so that positions of the first and second connectors 151 and 152 are fixed. In an embodiment, the supporting layer 170 may be comprised of a non-conductive polymer material. Top surfaces of the first and second connectors 151 and 152 may be exposed at a top surface of the supporting layer 170. Thus, the first and second connectors 151 and 152 may be used as electrical connection means that are electrically connected to an external device. Bottom surfaces of the first and second connectors 151 and 152 may be in contact with a top surface of the flexible molding member 150 and may be electrically connected to the first and second chips 110 and 120. In an embodiment, the first and second connectors 151 and 152 may be bonding pads that are comprised of conductive patterns. In an embodiment, the flexible molding member 150 may be comprised of an insulation material having elasticity so that the flexible molding member 150 warps, bends or extends when an external force is applied to the flexible package 100. The elastic insulation material of the flexible molding member 150 may include a material having a tensile elastic coefficient of about 0.01 GPa to about 0.1 Gpa. In an embodiment, the flexible molding member 150 may include a silicone resin material or a silicone rubber material.

The first bumps 114 of the first chip 110 may be physically and electrically connected to the second bumps 124 of the second chip 120. That is, the first bumps 114 may be attached to the second bumps 124 so that surfaces of the first bumps 114 are in direct contact with surfaces of the second bumps 124. The first pads 115*a* of the first chip 110 may be electrically connected to the first connectors 151 through first wires 161. The second pads 125*a* of the second chip 120 may be electrically connected to the second connectors 152 through second wires 162. Connection structures of the first pads 115*a* and the first connectors 151 with the first wires 161 may be disposed in the flexible molding member 150. Connection structures of the second pads 125*a* and the second connectors 152 with the second wires 162 may also be disposed in the flexible molding member 150.

Figure 3:
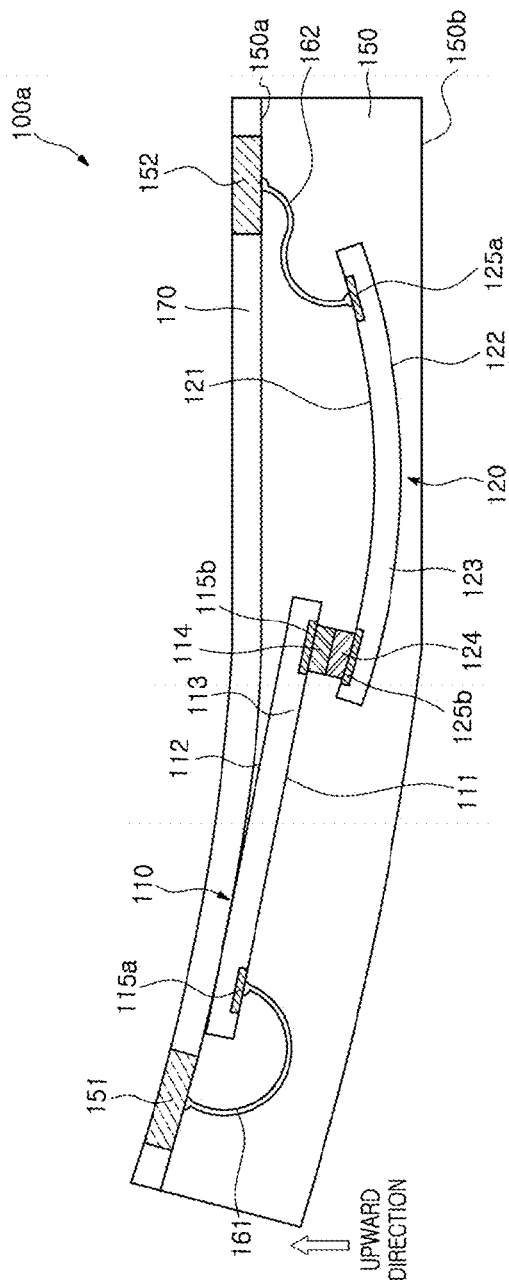
FIG. 3 is a cross-sectional view illustrating a representation of an example of a deformed shape of the flexible package illustrated in FIG. 1.

FIG. 3 is a cross-sectional view illustrating a deformed flexible package 100*a* having a deformed shape of the flexible package 100 illustrated in FIG. 1. Referring to FIG. 3, the same reference numerals as used in FIG. 1 denote the same elements. Referring to FIG. 3, if an external force is applied to a left portion of the flexible package 100 of FIG. 1 in an upward direction, a left portion of the flexible molding member 150 may bend upwardly to provide the deformed flexible package 100*a* having a warped left portion. While the left portion of the flexible package 100 bends upwardly to provide the deformed flexible package 100*a*, a left portion of the first chip 110 embedded in the flexible molding member 150 may also bend upwardly so that the first chip 110 gets straightened to have a flat shape. Since the first chip 110 gets straightened to provide the deformed flexible package 100*a*, the external force applied to the left portion of the flexible package 100 may be uniformly dispersed into the deformed flexible package 100*a* to suppress a phenomenon that a stress is concentrated at a specific portion of the deformed flexible package 100*a*, for example, at a joint portion of the first and second chips 110 and 120 to cause cracks.

Figure 4:
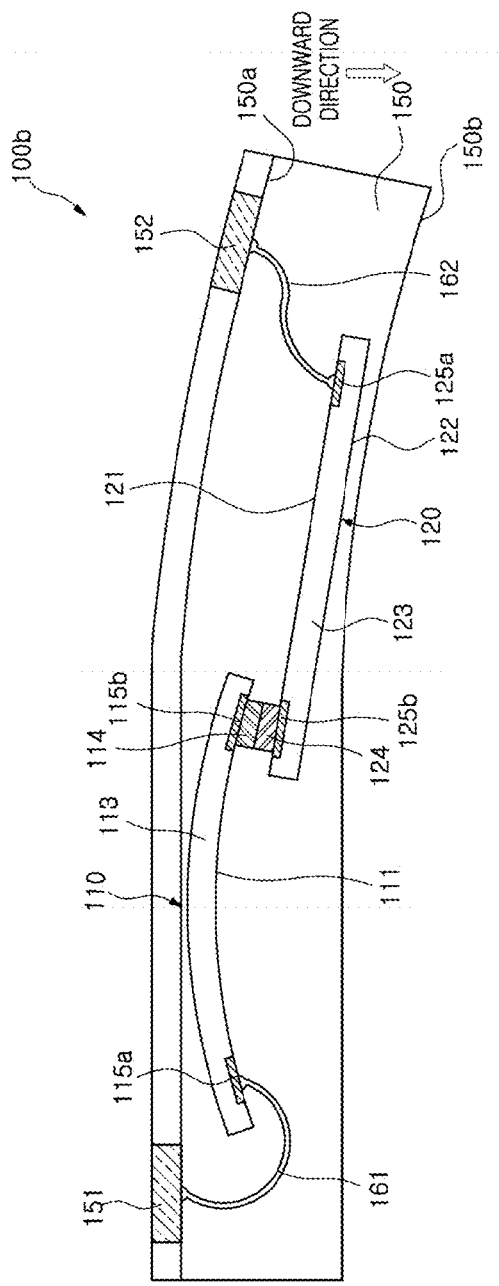
FIG. 4 is a cross-sectional view illustrating a representation of an example of a deformed shape of the flexible package illustrated in FIG. 1.

FIG. 4 is a cross-sectional view illustrating a deformed flexible package 100*b* having another deformed shape of the flexible package 100 illustrated in FIG. 1. Referring to FIG. 4, the same reference numerals as used in FIG. 1 denote the same elements. Referring to FIG. 4, if an external force is applied to a right portion of the flexible package 100 of FIG. 1 in an downward direction, a right portion of the flexible molding member 150 may bend downwardly to provide the deformed flexible package 100*b* having a warped right portion. While the right portion of the flexible package 100 bends downwardly to provide the deformed flexible package 100*b*, a right portion of the first chip 110 embedded in the flexible molding member 150 may also bend downwardly so that the second chip 120 gets straightened to have a flat shape. Since the second chip 120 gets straightened to provide the deformed flexible package 100*b*, the external force applied to the right portion of the flexible package 100 may be uniformly dispersed into the deformed flexible package 100b to suppress a phenomenon that a stress is concentrated at a specific portion of the deformed flexible package 100b, for example, at a joint portion of the first and second chips 110 and 120 to cause cracks.

Figure 5:
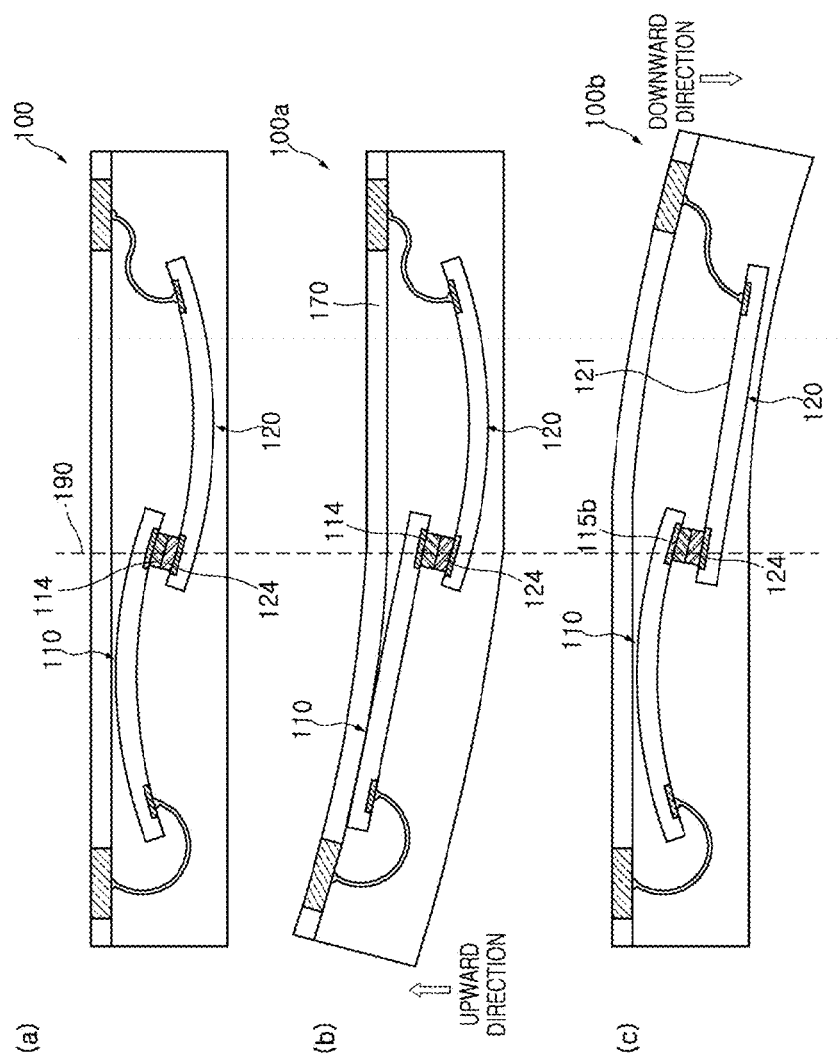
FIG. 5 illustrates a representation of an example of displacement of connection structures between bumps of the flexible package of FIG. 1 according to various shapes of the flexible package.

FIG. 5 illustrates displacement of connection structures between bumps of various packages. Referring to FIG. 5, the flexible package 100 illustrated in a portion (a) illustrates an initial shape before the flexible package 100 of FIG. 1 is deformed, the deformed flexible package 100a illustrated in a portion (b) illustrates a deformed shape after a left portion of the flexible package 100 of FIG. 1 bends upwardly (see FIG. 3), and the deformed flexible package 100b illustrated in a portion (c) illustrates a deformed shape after a right portion of the flexible package 100 of FIG. 1 bends downwardly (see FIG. 4). Referring to FIG. 5, the non-deformed flexible package 100, the deformed flexible package 100a and the deformed flexible package 100b are illustrated so that central portions of the non-deformed flexible package 100, the deformed flexible package 100a and the deformed flexible package 100b are located on a vertical dotted line 190. Referring to FIG. 5, in the case of the deformed flexible package 100a having a left portion bent upwardly, the displacement of the connection structure of the first bump 114 of the first chip 110 and the second bump 124 of the second chip 120 may be substantially negligible. Thus, even though the deformed flexible package 100a has a left portion bent upwardly, a stress applied to the bump connection structure of the deformed flexible package 100a may still be weak so that the bump connection structure is not destroyed. Similarly, even in the case of the deformed flexible package 100b having a right portion bent downwardly, the displacement of the connection structure of the first bump 114 of the first chip 110 and the second bump 124 of the second chip 120 may also be substantially negligible. Thus, even though the deformed flexible package 100b has a right portion bent downwardly, a stress applied to the bump connection structure of the deformed flexible package 100b may still be weak so that the bump connection structure is not destroyed.

Figure 6:
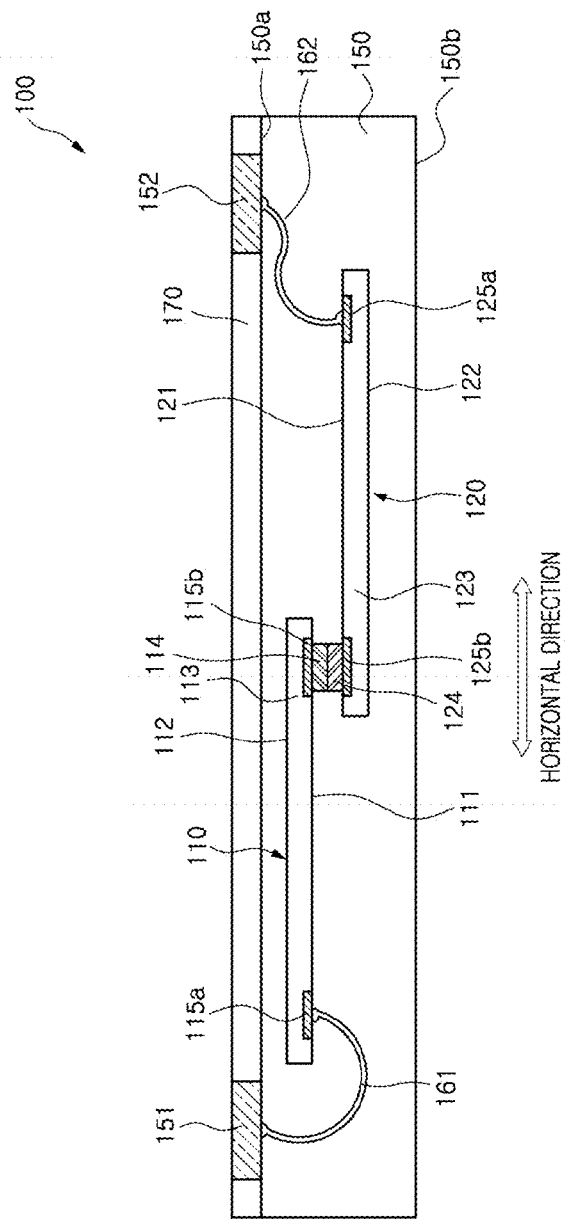
FIG. 6 is a cross-sectional view illustrating a representation of an example of a deformed shape of the flexible package illustrated in FIG. 1.

FIG. 6 is a cross-sectional view illustrating a deformed shape of the flexible package 100 illustrated in FIG. 1. Referring to FIG. 6, the same reference numerals as used in FIG. 1 denote the same elements. Referring to FIG. 6, if an external force is applied to the flexible package 100 in two opposite horizontal directions, the flexible package 100 may extend in a horizontal direction. In such a case, the first and second chips 110 and 120 embedded in the flexible molding member 150 may get straitened to have a flat shape.

Figure 7:
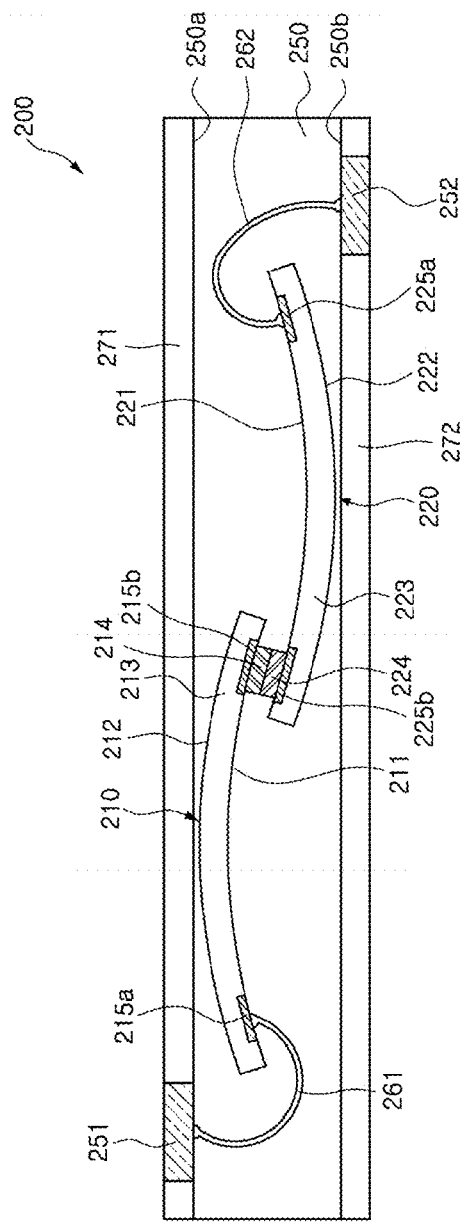
FIG. 7 is a cross-sectional view illustrating a representation of an example of a flexible package according to an embodiment.

FIG. 7 is a cross-sectional view illustrating a flexible package 200 according to an embodiment. Referring to FIG. 7, the flexible package 200 may be configured to include a first chip 210 and a second chip 220 which are embedded in a flexible molding member 250. Each of the first and second chips 210 and 220 may be comprised of an integrated circuit which is realized on and/or in a semiconductor substrate such as a silicon substrate. In an embodiment, the first and second chips 210 and 220 may be obtained by realizing integrated circuits on and/or in a single semiconductor substrate and by slicing the semiconductor substrate using a die sawing process. In such a case, the first and second chips 210 and 220 may be the same chip and may have the same function. The first and second chips 210 and 220 may have the same electrical connection structure. In an embodiment, the first chip 210 may be obtained by realizing first integrated circuits on and/or in a first semiconductor substrate and by slicing the first semiconductor substrate using a die sawing process, and the second chip 220 may be obtained by realizing second integrated circuits on and/or in a second semiconductor substrate and by slicing the second semiconductor substrate using a die sawing process. In such a case, the first and second chips 210 and 220 may be different chips and may have different functions from each other. Even though the first and second chips 210 and 220 are different chips having different functions from each other, the first and second chips 210 and 220 may be realized to have the same electrical connection structure.

The first chip 210 may include a first chip body 213 having a first top surface 211 and a first bottom surface 212 which are opposite to each other. The first chip 210 may include a first electrical connection structure disposed on the first top surface 211 of the first chip body 213. The first electrical connection structure may include a first bump 214 and first pads 215a and 215b. The first pads 215a and 215b may be disposed at both edges of the first top surface 211 of the first chip body 213, respectively. In an embodiment, the first pads 215a and 215b may be disposed adjacent to both edges of the first top surface 211 of the first chip body 213, respectively. The first bump 214 may be disposed on one of the first pads 215a and 215b. For example, the first bump 214 may be disposed on the first pad 215b. A bottom surface of the first bump 214 may be directly attached to a top surface of the first pad 215b. The second chip 220 may include a second chip body 223 having a second top surface 221 and a second bottom surface 222 which are opposite to each other. The second chip 220 may include a second electrical connection structure disposed on the second top surface 221 of the second chip body 223. The second electrical connection structure may include a second bump 224 and second pads 225a and 225b. The second pads 225a and 225b may be disposed at both edges of the second top surface 221 of the second chip body 223, respectively. In an embodiment, the second pads 225a and 225b may be disposed adjacent to both edges of the second top surface 221 of the second chip body 223, respectively. The second bump 224 may be disposed on one of the second pads 225a and 225b. For example, the second bump 224 may be disposed on the second pad 225b. A bottom surface of the second bump 224 may be directly attached to a top surface of the second pad 225b. Each of the first and second electrical connection structures of the first and second chips 210 and 220 may have substantially the same configuration as the first electrical connection structure of the first chip 110, which is described with reference to FIG. 2. Accordingly, a description of the first and second electrical connection structures of the first and second chips 210 and 220 will be omitted hereinafter to avoid duplicate explanation.

The first and second chips 210 and 220 may be embedded in the flexible molding member 250 without any compensation for warpage of the first and second chips 210 and 220. That is, each of the first and second chips 210 and 220 may warp to have a smile shape. The first chip 210 may be disposed to be upside down so that the first top surface 211 of the first chip 210 faces downwardly and may have a crying shape so that both edges of the first chip 210 are located at a lower level than a central portion of the first chip 210. The second chip 220 may be disposed so that the second top surface 221 of the second chip 220 faces upwardly and may have a smiling shape so that both edges of the second chip 220 are located at a higher level than a central portion of the second chip 220. Accordingly, the first top surface 211 of the first chip 210 may face the second top surface 221 of the second chip 220. The first chip 210 may be disposed at a higher level than the second chip 220. A vertical axis passing through a central portion of the first chip 210 may be offset by a certain distance along a lateral direction relative to a vertical axis passing through a central portion of the second chip 220. That is, an edge of the first chip 210 may overlap with an edge of the second chip 220. Specifically, the first and second chips 210 and 220 may be disposed so that the first bumps 214 of the first chip 210 overlap with the second bumps 224 of the second chip 220. The first and second bumps 214 and 224 may physically contact each other to provide connection structures that electrically connect the first chip 210 to the second chip 220. In such a case, the first pads 215a of the first chip 210 may be disposed in an edge (corresponding to a left edge in the drawing) of the flexible molding member 250 not to overlap with the second chip 220 and may be disposed to face downwardly. In addition, the second pads 225a of the second chip 220 may be disposed in another edge (corresponding to a right edge in the drawing) of the flexible molding member 250 not to overlap with the first chip 210 and may be disposed to face upwardly. That is, the first pads 215b of the first chip 210 may overlap with the second pads 225b of the second chip 220, respectively.

The flexible molding member 250 may have a top surface 250a and a bottom surface 250b that are opposite to each other. A first supporting layer 271 may be disposed on the top surface 250a of the flexible molding member 250. A second supporting layer 272 may be disposed on the bottom surface 250b of the flexible molding member 250. First connectors 251 may be disposed in an edge of the first supporting layer 271, for example, a left edge of the first supporting layer 271. Second connectors 252 may be disposed in an edge of the second supporting layer 272, for example, a right edge of the second supporting layer 272. The first connectors 251 may be disposed to penetrate the first supporting layer 271, and the second connectors 252 may be disposed to penetrate the second supporting layer 272. Each of the first and second supporting layers 271 and 272 may include a material which is harder than the flexible molding member 250. Thus, the first and second supporting layers 271 and 272 may support the first and second connectors 251 and 252 so that positions of the first and second connectors 251 and 252 are fixed. In an embodiment, each of the first and second supporting layers 271 and 272 may be comprised of a non-conductive polymer material. Top surfaces of the first connectors 251 may be exposed at a top surface of the first supporting layer 271, and bottom surfaces of the second connectors 252 may be exposed at a bottom surface of the second supporting layer 272. Thus, the first and second connectors 251 and 252 may be used as electrical connection means that are electrically connected to an external device. Bottom surfaces of the first connectors 251 may be in contact with a top surface of the flexible molding member 250 and may be electrically connected to the first chip 210. Top surfaces of the second connectors 252 may be in contact with a bottom surface of the flexible molding member 250 and may be electrically connected to the second chip 220. In an embodiment, the first and second connectors 251 and 252 may be bonding pads that are comprised of conductive patterns. In an embodiment, the flexible molding member 250 may be comprised of an insulation material having elasticity so that the flexible molding member 250 warps, bends or extends when an external force is applied to the flexible package 200. The elastic insulation material of the flexible molding member 250 may include a material having a tensile elastic coefficient of about 0.01 GPa to about 0.1 Gpa. In an embodiment, the flexible molding member 250 may include a silicone resin material or a silicone rubber material.

The first bumps 214 of the first chip 210 may be physically and electrically connected to the second bumps 224 of the second chip 220. That is, the first bumps 214 may be attached to the second bumps 224 so that surfaces of the first bumps 214 are in direct contact with surfaces of the second bumps 224. The first pads 215a of the first chip 210 may be electrically connected to the first connectors 251 through first wires 261. The second pads 225a of the second chip 220 may be electrically connected to the second connectors 252 through second wires 262. Connection structures of the first pads 215a and the first connectors 251 with the first wires 261 may be disposed in the flexible molding member 250. Connection structures of the second pads 225a and the second connectors 252 with the second wires 262 may also be disposed in the flexible molding member 250.

As described with reference to FIGS. 3, 4 and 5, even though a left portion of the flexible package 200 bends upwardly, a right portion of the flexible package 200 bends downwardly, or the flexible package 200 extends horizontally, a phenomenon that the first and second chips 210 and 220 are damaged may be suppressed. Thus, electrical connection structures of the first and second bumps 214 and 224, electrical connection structures of the first pads 215a and the first connectors 251, and electrical connection structures of the second pads 225a and the second connectors 252 may not be destroyed even though the flexible package 200 is deformed by an external force.

Figure 8:
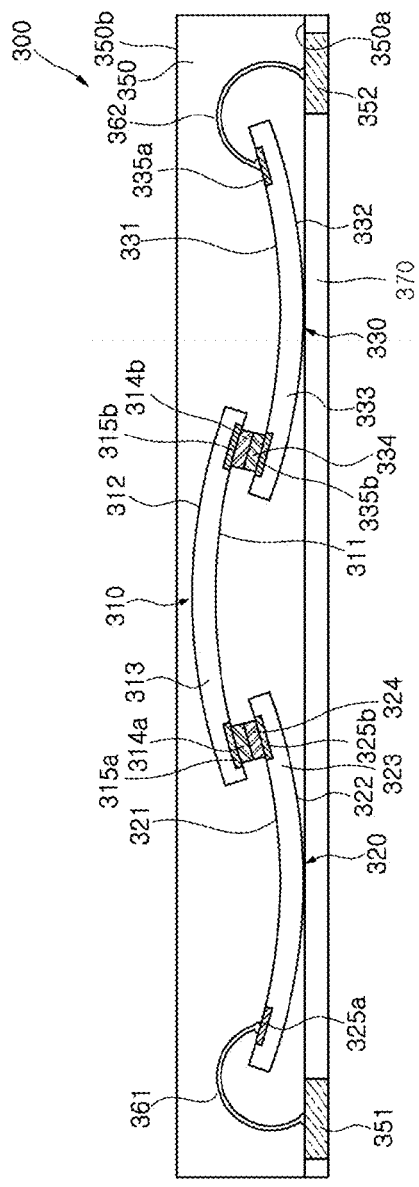
FIG. 8 is a cross-sectional view illustrating a representation of an example of a flexible package according to an embodiment.

FIG. 8 is a cross-sectional view illustrating a flexible package 300 according to an embodiment. Referring to FIG. 8, the flexible package 300 may be configured to include a first chip 310, a second chip 320 and a third chip 330 which are embedded in a flexible molding member 350. Each of the first, second and third chips 310, 320 and 330 may be comprised of an integrated circuit which is realized on and/or in a semiconductor substrate such as a silicon substrate. In an embodiment, the first, second and third chips 310, 320 and 330 may be obtained by realizing integrated circuits on and/or in a single semiconductor substrate and by slicing the semiconductor substrate using a die sawing process. In such a case, the first, second and third chips 310, 320 and 330 may be the same chip and may have the same function. The first, second and third chips 310, 320 and 330 may have the same electrical connection structure. In an embodiment, the first chip 310 may be obtained by realizing first integrated circuits on and/or in a first semiconductor substrate and by slicing the first semiconductor substrate using a die sawing process, the second chip 320 may be obtained by realizing second integrated circuits on and/or in a second semiconductor substrate and by slicing the second semiconductor substrate using a die sawing process, and the third chip 330 may be obtained by realizing third integrated circuits on and/or in a third semiconductor substrate and by slicing the third semiconductor substrate using a die sawing process. In such a case, the first, second and third chips 310, 320 and 330 may be different chips and may have different functions from each other. Even though the first, second and third chips 310, 320 and 330 are different chips having different functions from each other, the first, second and third chips 310, 320 and 330 may be realized to have the same electrical connection structure.

The first chip 310 may include a first chip body 313 having a first top surface 311 and a first bottom surface 312 which are opposite to each other. In an embodiment, the first bottom surface 312 may have substantially a convex shape facing towards the bottom surface 350b of the flexible molding member 350. In an embodiment, the first top surface 311 may have substantially a concave shape facing towards the top surface 350a of the flexible molding member 350. The first chip 310 may include first electrical connection structures disposed on the first top surface 311 of the first chip body 313. The first electrical connection structures may include first bumps 314a and 314b and first pads 315a and 315b. The first pads 315a and 315b may be disposed at both edges of the first top surface 311 of the first chip body 313, respectively. In an embodiment, the first pads 315a and 315b may be disposed adjacent to both edges of the first top surface 311 of the first chip body 313, respectively. The first bumps 314a and 314b may be disposed on the first pads 315a and 315b, respectively. A bottom surface of the first bump 314a may be directly attached to a top surface of the first pad 315a, and a bottom surface of the first bump 314b may be directly attached to a top surface of the first pad 315b. The second chip 320 may include a second chip body 323 having a second top surface 321 and a second bottom surface 322 which are opposite to each other. In an embodiment, the second bottom surface 322 may have substantially a convex shape facing towards the top surface 350a of the flexible molding member 350. In an embodiment, the second top surface 321 may have substantially a concave shape facing towards the bottom surface 350b of the flexible molding member 350. The second chip 320 may include a second electrical connection structure disposed on the second top surface 321 of the second chip body 323. The second electrical connection structure may include a second bump 324 and second pads 325a and 325b. The second pads 325a and 325b may be disposed at both edges of the second top surface 321 of the second chip body 323, respectively. In an embodiment, the second pads 325a and 325b may be disposed adjacent to both edges of the second top surface 321 of the second chip body 323, respectively. The second bump 324 may be disposed on one of the second pads 325a and 325b. For example, the second bump 324 may be disposed on the second pad 325b. A bottom surface of the second bump 324 may be directly attached to a top surface of the second pad 325b. The third chip 330 may include a third chip body 333 having a third top surface 331 and a third bottom surface 332 which are opposite to each other. In an embodiment, the third bottom surface 332 may have substantially a convex shape facing towards the top surface 350a of the flexible molding member 350. In an embodiment, the third top surface 331 may have substantially a concave shape facing towards the bottom surface 350b of the flexible molding member 350. The third chip 330 may include a third electrical connection structure disposed on the third top surface 331 of the third chip body 333. The third electrical connection structure may include a third bump 334 and third pads 335a and 335b. The third pads 335a and 335b may be disposed at both edges of the third top surface 331 of the third chip body 333, respectively. In an embodiment, the third pads 335a and 335b may be disposed adjacent to both edges of the third top surface 331 of the third chip body 333, respectively. The third bump 334 may be disposed on one of the second pads 335a and 335b. For example, the third bump 334 may be disposed on the third pad 335b. A bottom surface of the third bump 334 may be directly attached to a top surface of the third pad 335b. Each of the first, second and third electrical connection structures of the first, second and third chips 310, 320 and 330 may have substantially the same configuration as the first electrical connection structure of the first chip 110, which is described with reference to FIG. 2. Accordingly, a description of the first, second and third electrical connection structures of the first, second and third chips 310, 320 and 330 will be omitted hereinafter to avoid duplicate explanation.

The first, second and third chips 310, 320 and 330 may be embedded in the flexible molding member 350 without any compensation for warpage of the first, second and third chips 310, 320 and 330. That is, each of the first, second and third chips 310, 320 and 330 may warp to have a smile shape. Specifically, the first chip 310 may be disposed to be upside down so that the first top surface 311 of the first chip 310 faces downwardly and may have a crying shape so that both edges of the first chip 310 are located at a lower level than a central portion of the first chip 310. The second chip 320 may be disposed so that the second top surface 321 of the second chip 320 faces upwardly and may have a smiling shape so that both edges of the second chip 320 are located at a higher level than a central portion of the second chip 320. The third chip 330 may be disposed so that the third top surface 331 of the third chip 330 faces upwardly and may have a smiling shape so that both edges of the third chip 330 are located at a higher level than a central portion of the third chip 330. That is, the first chip 310 and the second chip 320 may be disposed so that the first top surface 311 of the first chip 310 faces the second top surface 321 of the second chip 320, and the first chip 310 and the third chip 330 may be disposed so that the first top surface 311 of the first chip 310 faces the third top surface 331 of the third chip 330. The first chip 310 may be disposed at a higher level than the second the third chips 320 and 330. A vertical axis passing through a central portion of the second chip 320 may be offset by a certain distance along a lateral direction relative to a vertical axis passing through a central portion of the first chip 310, and a vertical axis passing through a central portion of the third chip 330 may also be offset by a certain distance along a lateral direction relative to the vertical axis passing through the central portion of the first chip 310. That is, both edge of the first chip 310 may overlap with an edge of the second chip 320 and an edge of the third chip 330, respectively. Specifically, the first and second chips 310 and 320 may be disposed so that the first bumps 314a of the first chip 310 overlap with the second bumps 324 of the second chip 320. The first and second bumps 314a and 324 may physically contact each other to provide connection structures that electrically connect the first chip 310 to the second chip 320. The first and third chips 310 and 330 may be disposed so that the first bumps 314a of the first chip 310 overlap with the third bumps 334 of the third chip 330. The first and third bumps 314b and 334 may physically contact each other to provide connection structures that electrically connect the first chip 310 to the third chip 330. The second pads 325a of the second chip 320 may be disposed in an edge (corresponding to a left edge in the drawing) of the flexible molding member 350 not to overlap with the first chip 310 and may be disposed to face upwardly. In addition, the third pads 335a of the third chip 330 may be disposed in another edge (corresponding to a right edge in the drawing) of the flexible molding member 350 not to overlap with the first chip 310 and may be disposed to face upwardly.

The flexible molding member 350 may have a top surface 350a and a bottom surface 350b that are opposite to each other. A supporting layer 370 may be disposed on the top surface 350a of the flexible molding member 350. First connectors 351 may be disposed in an edge of the supporting layer 370, for example, a left edge of the supporting layer 370. Second connectors 352 may be disposed in another edge of the supporting layer 370, for example, a right edge of the supporting layer 370. The first and second connectors 351 and 352 may be disposed to penetrate the supporting layer 370. The supporting layer 370 may include a material which is harder than the flexible molding member 350. Thus, the supporting layer 370 may support the first and second connectors 351 and 352 so that positions of the first and second connectors 351 and 352 are fixed. In an embodiment, the supporting layer 370 may be comprised of a non-conductive polymer material. Top surfaces of the first and second connectors 351 and 352 opposite to the flexible molding member 350 may be exposed at a top surface of the supporting layer 370 opposite to the flexible molding member 350. Thus, the first and second connectors 351 and 352 may be used as electrical connection means that are electrically connected to an external device. Bottom surfaces of the first connectors 351 may be in contact with the top surface 350a of the flexible molding member 350 and may be electrically connected to the second chip 320, and bottom surfaces of the second connectors 352 may be in contact with the top surface 350a of the flexible molding member 350 and may be electrically connected to the third chip 330. In an embodiment, the first and second connectors 351 and 352 may be bonding pads that are comprised of conductive patterns. In an embodiment, the flexible molding member 350 may be comprised of an insulation material having elasticity so that the flexible molding member 350 warps, bends or extends when an external force is applied to the flexible package 300. The elastic insulation material of the flexible molding member 350 may include a material having a tensile elastic coefficient of about 0.01 GPa to about 0.1 Gpa. In an embodiment, the flexible molding member 350 may include a silicone resin material or a silicone rubber material.

The first bumps 314a of the first chip 310 may be physically and electrically connected to the second bumps 324 of the second chip 320. That is, the first bumps 314a may be attached to the second bumps 324 so that surfaces of the first bumps 314a are in direct contact with surfaces of the second bumps 324. The first bumps 314b of the first chip 310 may be physically and electrically connected to the third bumps 334 of the third chip 330. That is, the first bumps 314b may be attached to the third bumps 334 so that surfaces of the first bumps 314b are in direct contact with surfaces of the third bumps 334. The second pads 325a of the second chip 320 may be electrically connected to the first connectors 351 through first wires 361. The third pads 335a of the third chip 330 may be electrically connected to the second connectors 352 through second wires 362. Connection structures of the second pads 325a and the first connectors 351 with the first wires 361 may be disposed in the flexible molding member 350. Connection structures of the third pads 335a and the second connectors 352 with the second wires 362 may also be disposed in the flexible molding member 350.

Figure 9:
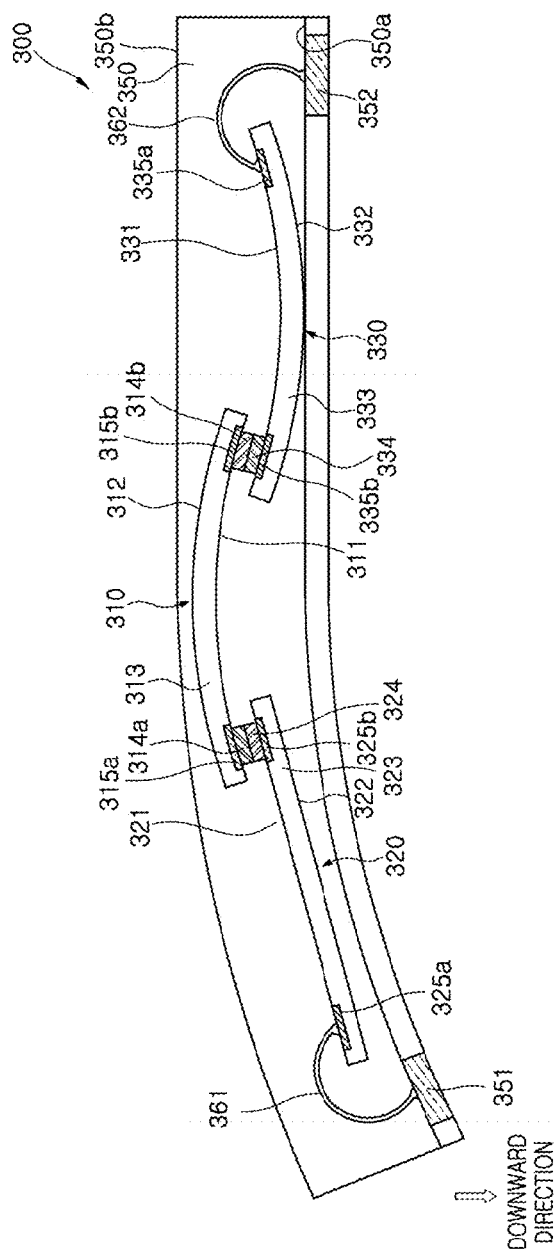
FIG. 9 is a cross-sectional view illustrating a representation of an example of a deformed shape of the flexible package illustrated in FIG. 8.

FIG. 9 is a cross-sectional view illustrating a deformed shape of the flexible package 300 illustrated in FIG. 8. referring to FIG. 9, the same reference numerals as used in FIG. 8 denote the same elements. Referring to FIG. 9, if an external force is applied to a left portion of the flexible package 300 in a downward direction, a left portion of the flexible molding member 350 may warp downwardly. In such a case, a left portion of the second chip 320 embedded in the flexible molding member 350 may bend downwardly so that the second chip 320 gets straightened to have a flat shape. Since the second chip 320 gets straightened to have flat shape, the external force applied to the left portion of the flexible package 300 may be uniformly dispersed into the flexible package 300 to suppress a phenomenon that a stress is concentrated at a specific portion of the flexible package 300, for example, at a joint portion of the first and second chips 310 and 320 to cause cracks.

Figure 10:
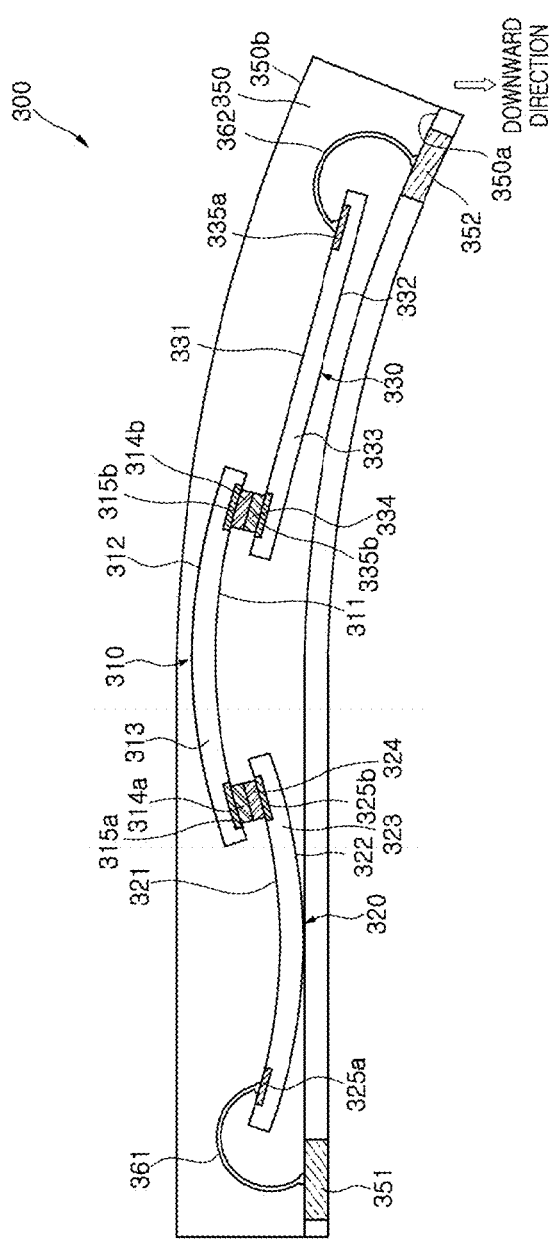
FIG. 10 is a cross-sectional view illustrating a representation of an example of a deformed shape of the flexible package illustrated in FIG. 8.

FIG. 10 is a cross-sectional view illustrating a deformed shape of the flexible package 300 illustrated in FIG. 8. Referring to FIG. 10, the same reference numerals as used in FIG. 8 denote the same elements. Referring to FIG. 10, if an external force is applied to a right portion of the flexible package 300 in a downward direction, a right portion of the flexible molding member 350 may warp downwardly. In such a case, a right portion of the third chip 330 embedded in the flexible molding member 350 may bend downwardly so that the third chip 330 gets straightened to have a flat shape. Since the third chip 330 gets straightened to have flat shape, the external force applied to the right portion of the flexible package 300 may be uniformly dispersed into the flexible package 300 to suppress a phenomenon that a stress is concentrated at a specific portion of the flexible package 300, for example, at a joint portion of the first and third chips 310 and 330 to cause cracks.

Figure 11:
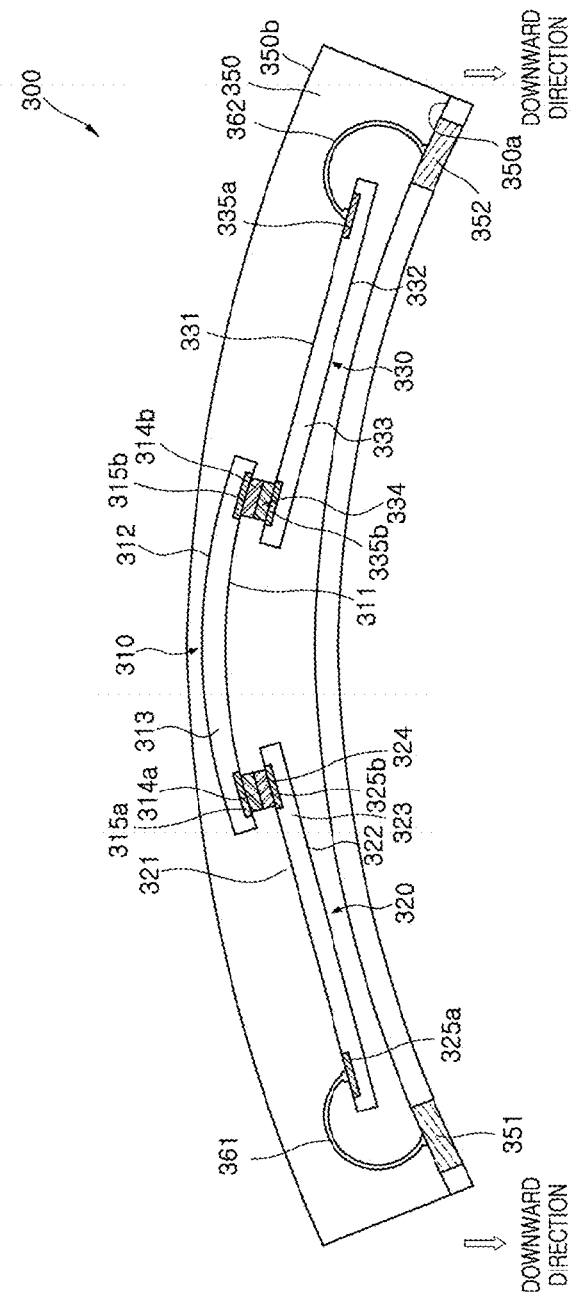
FIG. 11 is a cross-sectional view illustrating a representation of an example of a deformed shape of the flexible package illustrated in FIG. 8.

FIG. 11 is a cross-sectional view illustrating a deformed shape of the flexible package 300 illustrated in FIG. 8. Referring to FIG. 11, the same reference numerals as used in FIG. 8 denote the same elements. Referring to FIG. 11, if an external force is applied to a left portion and a right portion of the flexible package 300 in a downward direction, a left portion and a right portion of the flexible molding member 350 may warp downwardly. In such a case, a left portion of the second chip 320 and a right portion of the third chip 330 may bend downwardly so that each of the second chip 320 and the third chip 330 get straightened to have a flat shape. Since the second and third chips 320 and 330 get straightened to have flat shape, the external force applied to the left portion and the right portion of the flexible package 300 may be uniformly dispersed into the flexible package 300 to suppress a phenomenon that a stress is concentrated at specific portions of the flexible package 300, for example, at joint portions of the first, second and third chips 310, 320 and 330 to cause cracks.

Figure 12:
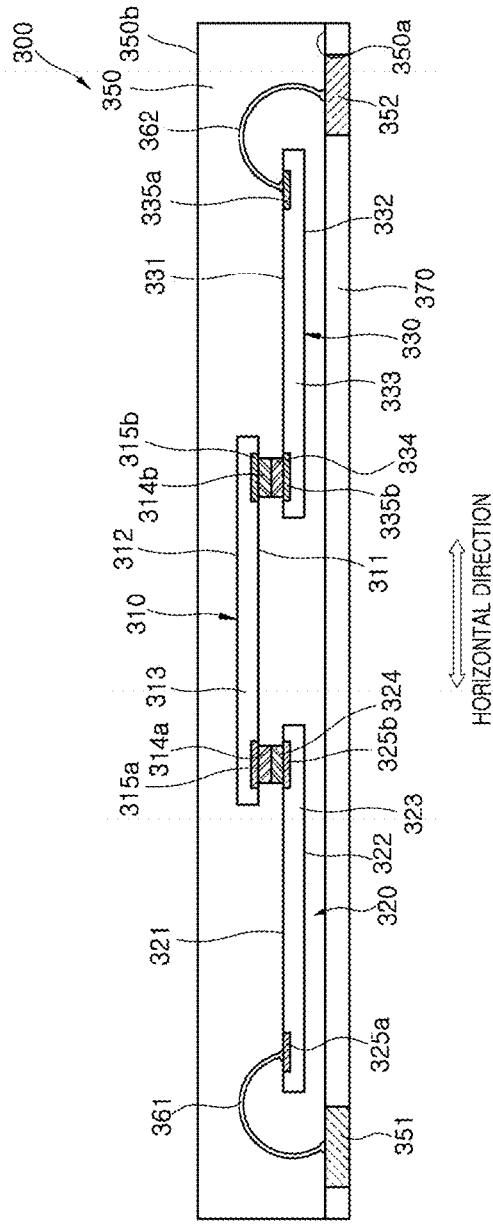
FIG. 12 is a cross-sectional view illustrating a representation of an example of a deformed shape of the flexible package illustrated in FIG. 8.

FIG. 12 is a cross-sectional view illustrating a deformed shape of the flexible package 300 illustrated in FIG. 8. Referring to FIG. 12, the same reference numerals as used in FIG. 8 denote the same elements. Referring to FIG. 12, if an external force is applied to the flexible package 300 in two opposite horizontal directions, the flexible package 300 may extend in a horizontal direction. In such a case, the first, second and third chips 310, 320 and 330 embedded in the flexible molding member 350 may get straitened to have a flat shape.

Figure 13:
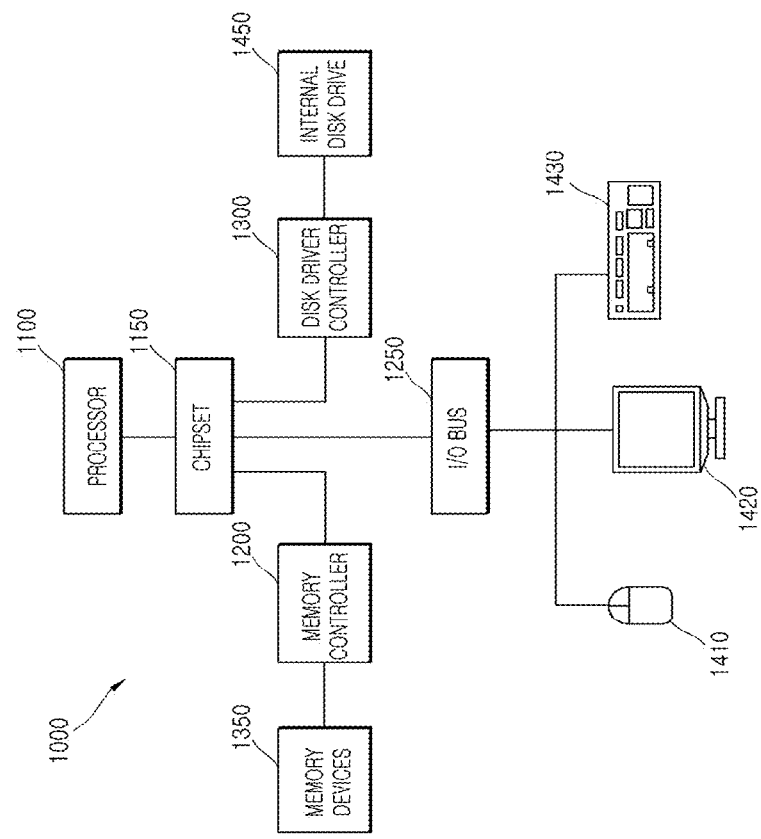
FIG. 13 illustrates a block diagram of an example of a representation of a system employing a flexible package with the various embodiments discussed above with relation to FIGS. 1-12.

The flexible packages as discussed above (see FIGS. 1-12) are particular useful in the design of memory devices, processors, and computer systems. For example, referring to FIG. 13, a block diagram of a system employing a flexible package in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one flexible package as discussed above with reference to FIGS. 1-12. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one flexible package as discussed above with relation to FIGS. 1-12, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 13 is merely one example of a system 1000 employing a flexible package as discussed above with relation to FIGS. 1-12. In alternate embodiments, such as, for example but not limited to, cellular phones or digital cameras, the components may differ from the embodiments illustrated in FIG. 13.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A flexible package comprising:
a flexible molding member including a top surface;
a first chip within the flexible molding member, and including a first top surface;
a second chip within the flexible molding member, and including a second top surface;
a third chip within the flexible molding member, and including a third top surface,
wherein the first, second, and third top surfaces are substantially concave,
wherein the first top surface faces towards the top surface of the flexible molding member,
wherein the second and third top surfaces face away from the top surface of the flexible molding member, and
wherein at least one of the first, second, and third chips are configured to be straightened in response to an external force applied to the flexible molding member.

2. The flexible package of claim 1,
wherein the first chip includes a pair of first pads disposed on the first top surface,
wherein the second chip includes a second pad disposed on the second top surface,
wherein the third chip includes a third pad disposed on the third top surface, and
wherein a pad from the pair of first pads overlaps with the second pad and the other pad from the pair of first pads overlaps with the third pad.

3. The flexible package of claim 2,
wherein the pad from the pair of first pads is coupled to the second pad through a first bump and the other pad from the pair of first pads is coupled to the third pad through a second bump.

4. The flexible package of claim 1,
wherein the first chip includes a first bottom surface opposite the first top surface, the first bottom surface substantially convex and facing away from the top surface of the flexible molding member,
wherein the second chip includes a second bottom surface opposite the second top surface, the second bottom surface substantially convex and facing towards the top surface of the flexible molding member, and
wherein the third chip includes a third bottom surface opposite the third top surface, the third bottom surface substantially convex and facing towards the top surface of the flexible molding member.

5. The flexible package of claim 1,
wherein an edge of the first ship overlaps with second chip and another edge of the first overlaps with the third chip.

6. The flexible package of claim 1, wherein the first chip is located at higher level than the second and third chips.

7. The flexible package of claim 1, wherein the second and third chips are disposed at the same level.

8. The flexible package of claim 1, wherein
the first chip includes a pair of first electrical connection structures disposed on the first top surface, the pair of first electrical connection structures being disposed on both edges of the first top surface of the first chip, respectively;
the second chip includes a second electrical connection structure disposed on the second top surface, the second electrical connection structure; and
the third chip includes a third electrical connection structure disposed on the third top surface.

9. The flexible package of claim 8, further comprising:
a first connector and a second connector disposed on the flexible molding member, the first connector and the second connector being disposed on both edges of one surface of the flexible molding member, respectively.

10. The flexible package of claim 9, wherein
one of the pair of first electrical connection structures overlaps with the second electrical connection structure of the second chip; and
the other one of the pair of first electrical connection structures overlaps with the third electrical connection structure of the third chip.

11. The flexible package of claim 9, wherein
the pair of first electrical connection structures include a pair of first pads and a pair of first bumps;
the second electrical connection structure includes a pair of second pads and a second bump; and
the third electrical connection structure includes a pair of third pads and a third bump.

12. The flexible package of claim 11, wherein
the pair of first pads are disposed on both edges of the first top surface of the first chip, respectively;
the pair of first bumps are disposed on the pair of first pads, respectively;
the pair of second pads are disposed on both edges of the second top surface of the second chip, respectively;
the second bump is disposed on one of the pair of second pads;
the pair of third pads are disposed on both edges of the third top surface of the third chip, respectively; and
the third bump is disposed on one of the pair of third pads.

13. The flexible package of claim 12, wherein
one of the pair of first bumps overlaps with the second bump; and
the other one of the pair of first bumps overlaps with the third bump.

14. The flexible package of claim 13, wherein
one of the pair of first bumps is physically and electrically connected to the second bump; and
the other one of the pair of first bumps is physically and electrically connected to the third bump.

15. The flexible package of claim 14, wherein
one of the pair of second pads, which is not attached to the second bump, is connected to the first connector by a first wire; and
one of the pair of third pads, which is not attached to the third bump, is connected to the second connector by a second wire.

16. The flexible package of claim 9, further comprising a supporting layer that is disposed on the flexible molding member to support the first connector and the second connector, the supporting layer being comprised of a non-conductive polymer material.

17. The flexible package of claim 16, wherein the supporting layer includes a material which is harder than the flexible molding member.

18. The flexible package of claim 1, wherein the flexible molding member includes an insulation material having a tensile elastic coefficient of about 0.01 GPa to about 0.1 Gpa so that the flexible molding member warps upwardly or downwardly or extends in a horizontal direction when an external force is applied to the flexible molding member.

19. The flexible package of claim 18, wherein the insulation material includes a silicone resin material or a silicone rubber material.

* * * * *